US010566072B2

(12) United States Patent
Huang (10) Patent No.: US 10,566,072 B2
(45) Date of Patent: Feb. 18, 2020

(54) DETECTION METHODS FOR NOR FLASH MEMORY (71) Applicant: Winbond Electronics Corp., Taichung (TW)

(72) Inventor: Koying Huang, San Jose, CA (US)

(73) Assignee: WINBOND ELECTRONICS CORP., Taichung (TW)

(*) Notice: Subject to any disclaimer, the term of this patent is extended or adjusted under 35 U.S.C. 154(b) by 0 days.

(21) Appl. No.: 15/913,451

(22) Filed: Mar. 6, 2018

(65) Prior Publication Data

US 2019/0279732 A1 Sep. 12, 2019

(51) Int. Cl.
G11C 29/00 (2006.01)
G11C 29/02 (2006.01)
G11C 29/44 (2006.01)
G11C 29/50 (2006.01)
H01L 27/115 (2017.01)
G11C 29/12 (2006.01)

(52) U.S. Cl.
CPC ............ *G11C 29/025* (2013.01); *G11C 29/44* (2013.01); *G11C 29/50* (2013.01); *G11C 2029/1202* (2013.01); *G11C 2029/5006* (2013.01); *H01L 27/115* (2013.01)

(58) Field of Classification Search
None
See application file for complete search history.

(56) References Cited

U.S. PATENT DOCUMENTS

| 7,042,778 | B2 | 5/2006 | Chevallier |
| 9,548,129 | B2 | 1/2017 | Paudel et al. |
| 2006/0098505 | A1* | 5/2006 | Cho .................. G11C 16/0425 365/201 |
| 2018/0061505 | A1 | 3/2018 | Ghai et al. |

FOREIGN PATENT DOCUMENTS

TW 200615555 A 5/2006

* cited by examiner

Primary Examiner — Douglas King
(74) Attorney, Agent, or Firm — Muncy, Geissler, Olds & Lowe, P.C.

(57) ABSTRACT

A method for detecting a flash memory array includes a plurality of word lines, a plurality of bit lines, and a source line, includes executing a first detection process. The first detection process includes: applying a first positive voltage to a P-type well of the flash memory array; applying a ground to all the word lines; floating the bit lines and the source line; determining whether a leakage current flowing through the P-type well exceeds a leakage threshold; and when the leakage current exceeds the leakage threshold, determining that at least one of the word lines is short-circuited with at least one of the bit lines or the source line.

20 Claims, 13 Drawing Sheets

DETECTION METHODS FOR NOR FLASH MEMORY

BACKGROUND OF THE INVENTION

Field of the Invention

The disclosure relates generally to methods for detecting defects in a NOR flash memory.

Description of the Related Art

NOR Flash memory has ECC to correct some bits read failure. However, some process defects, such as a word line short-circuited with a bit line or a word line short-circuited with the source line, may cause the whole memory array to be erased, or may cause a read fail or a programming fail. It may even cause the data to be unrecoverable by ECC.

Therefore, we need a method for detecting defects in a flash memory array, such as a word line short-circuited with a bit line or a word line short-circuited with the source line. In addition, a special reading method is also needed to read out data stored on the defective word line for the issue of data retention. Since the defective array cannot be erased, the special reading method may be configured to move the data stored in the defective array to a redundancy array or another array.

BRIEF SUMMARY OF THE INVENTION

After executing the detection method provided herein, the system could be aware of which flash memory array is damaged so that the system may adopt a series of operations to protect the data stored in the flash memory array.

In an embodiment, a method for detecting a flash memory array comprising a plurality of word lines, a plurality of bit lines, and a source line comprises: executing a first detection process, wherein the first detection process comprises: applying a first positive voltage to a P-type well of the flash memory array; applying a ground to all the word lines; floating the bit lines and the source line; determining whether a leakage current flowing through the P-type well exceeds a leakage threshold; and when the leakage current exceeds the leakage threshold, determining that at least one of the word lines is short-circuited with at least one of the bit lines or the source line.

In an embodiment, a device comprises a flash memory array, a bias circuit, a sense circuit, and a controller. The flash memory array comprises a plurality of word lines, a plurality of bit lines, a source line, and a P-type well. The bias circuit generates voltages and currents for the flash memory array. The sense circuit is configured to sense logic levels of the word lines, the bit lines, the source line, and a leakage current of the P-type well. The controller selects the word lines and the bit lines and executing a method comprising a first detection process, wherein the first detection process comprises: applying a first positive voltage to a P-type well of the flash memory array; applying a ground to all the word lines; floating the bit lines and the source line; determining whether the leakage current flowing through the P-type well exceeds a leakage threshold; and when the leakage current exceeds the leakage threshold, determining that at least one of the word lines is short-circuited with at least one of the bit lines or the source line.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 1:
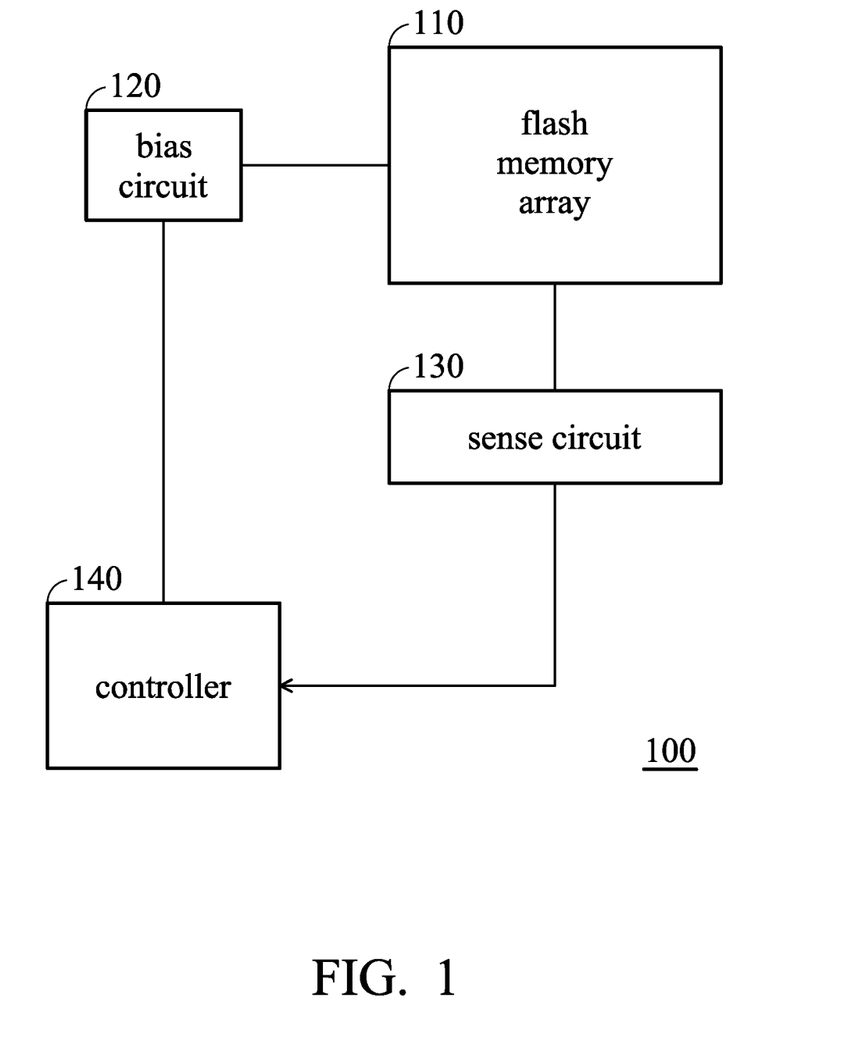
FIG. 1 is a block diagram of a flash memory device in accordance with an embodiment of the invention

FIG. 1 is a block diagram of a flash memory device in accordance with an embodiment of the invention. As shown in FIG. 1, the flash memory device 100 includes a flash memory array 110, a bias circuit 120, a sense circuit 130, and a controller 140. The flash memory array 110 includes a plurality of word lines, a plurality of bit lines, a source line, and a P-type well, which will be illustrated in the following paragraphs.

According to an embodiment of the invention, the flash memory array 110 is an NOR flash memory array. According to other embodiments, the flash memory device 100 may have a plurality of flash memory arrays 110. Only one flash memory array 110 is illustrated in FIG. 1, but not intended to be limited thereto.

The bias circuit 120 is configured to generate voltages and currents for the flash memory array 110. The sense circuit 130 is configured to sense the logic levels and currents of the word lines, the bit lines, the source line, and the P-type well.

Figure 2:
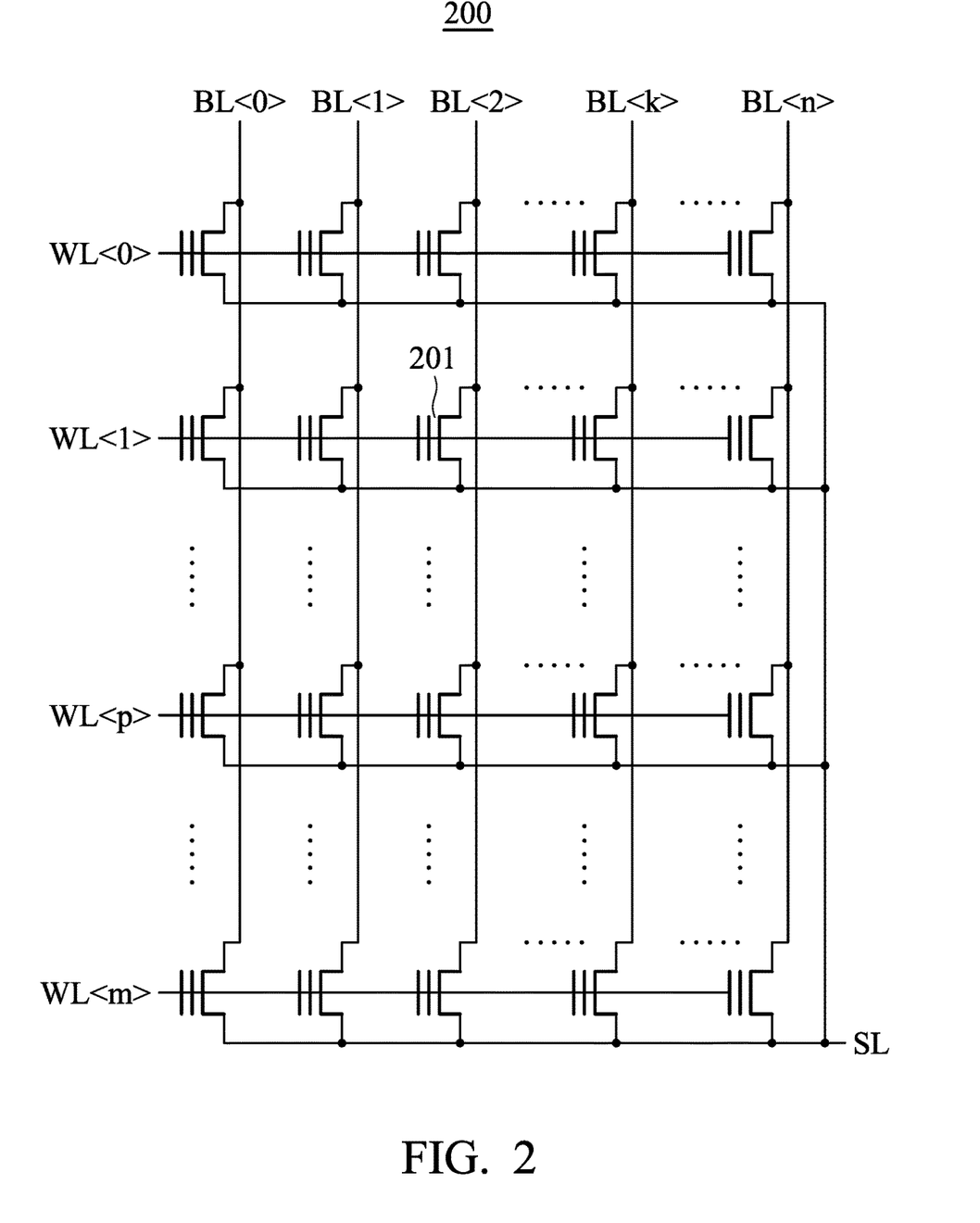
FIG. 2 is a schematic diagram of the flash memory array in accordance with an embodiment of the invention.

FIG. 2 is a schematic diagram of the flash memory array in accordance with an embodiment of the invention. As shown in FIG. 2, the flash memory array 200, which corresponds to the flash memory array 110, includes a plurality of bit lines BL<0>, BL<1>, ..., BL<k>, ..., BL<n>, a plurality of word lines WL<0>, WL<1>, ..., WL<p>, ..., WL<m>, and a source line SL, in which the flash memory array 200 includes m×n of flash memory cells.

According to an embodiment of the invention, when the controller 140 in FIG. 1 selects the memory cell 201 in FIG. 2, the bias circuit 120 generates corresponding voltages to the word line WL<1>, the bit line BL<2>, and the source line SL, such that the sense circuit 130 reads out the data stored in the memory cell 201 and transmits the data to the controller 140.

Figure 3:
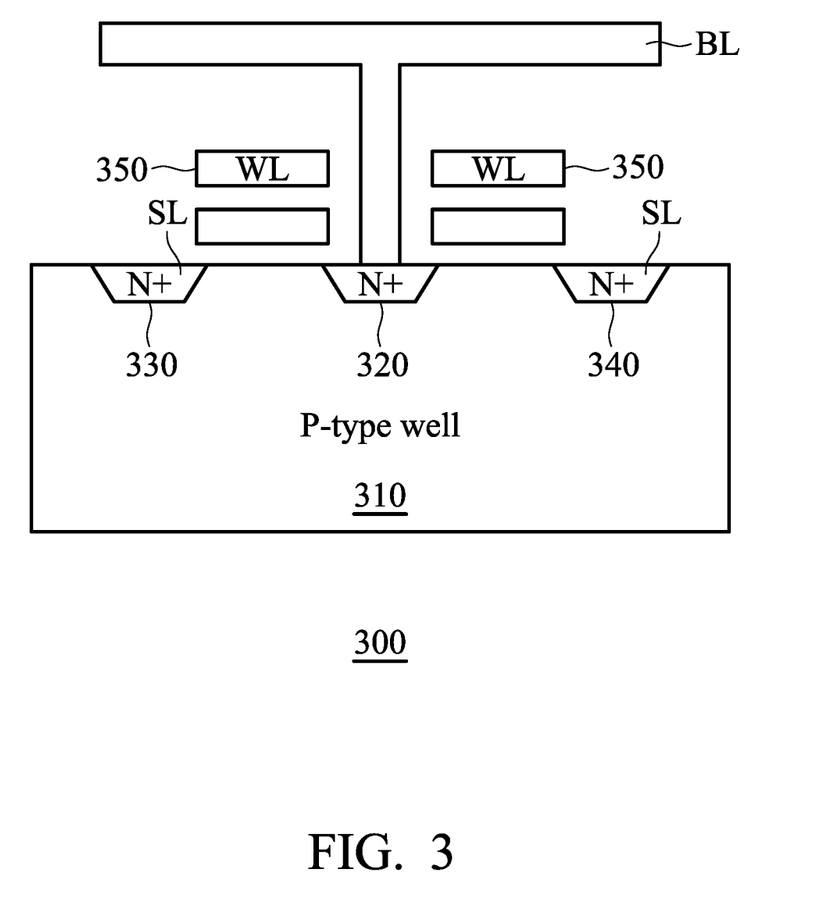
FIG. 3 is a cross-section view of a flash memory cell in accordance with an embodiment of the invention.

FIG. 3 is a cross-section view of a flash memory cell in accordance with an embodiment of the invention. According to an embodiment of the invention, the cross-section view of the flash memory array 110 is illustrated by a flash memory cell 300. As shown in FIG. 3, the flash memory cell 300 includes a P-type well 310, a first N-type diffusion 320, a second N-type diffusion 330, a third N-type diffusion 340, and a gate terminal 350. The second N-type diffusion 330 and the third N-type diffusion 340 are coupled to the source line SL. The first N-type diffusion is coupled to a bit line BL, and the gate terminal 350 is coupled to the word line.

After a series of the erase operations are executed on a flash memory array, it may cause the bit line(s) or the source line is/are short-circuited with the word line(s). Therefore, the invention proposes a method to detect such a defect.

Figure 4:
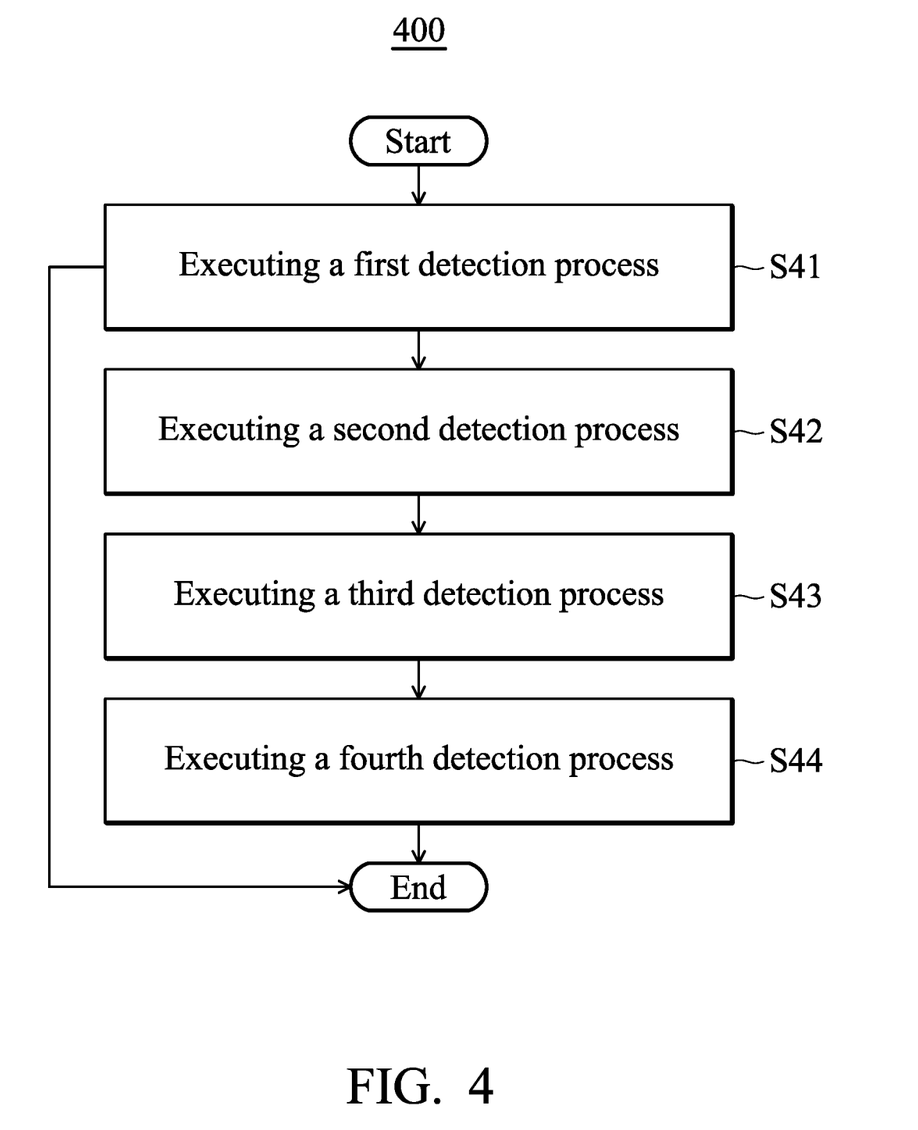
FIG. 4 is a flow chart of a detection method in accordance with an embodiment of the invention.

FIG. 4 is a flow chart of a detection method in accordance with an embodiment of the invention. As shown in FIG. 4, a first detection process is executed (Step S41) to determine whether the flash memory array 110 has a defect. When it is determined that the flash memory array 110 has at least one defect, a second detection process is executed (Step S42) to confirm that the defect is occurred on which word line.

A third detection process is executed (Step S43) to determine whether the source line is short-circuited with the defective word line(s). A fourth detection process is further executed (Step S44) to determine which bit line is short-circuited with the defective word line(s). The first process, second process, third process, and fourth process will be described in detail in the following paragraphs. According to an embodiment of the invention, the detection method 400 may be terminated after Step S41.

Figure 5:
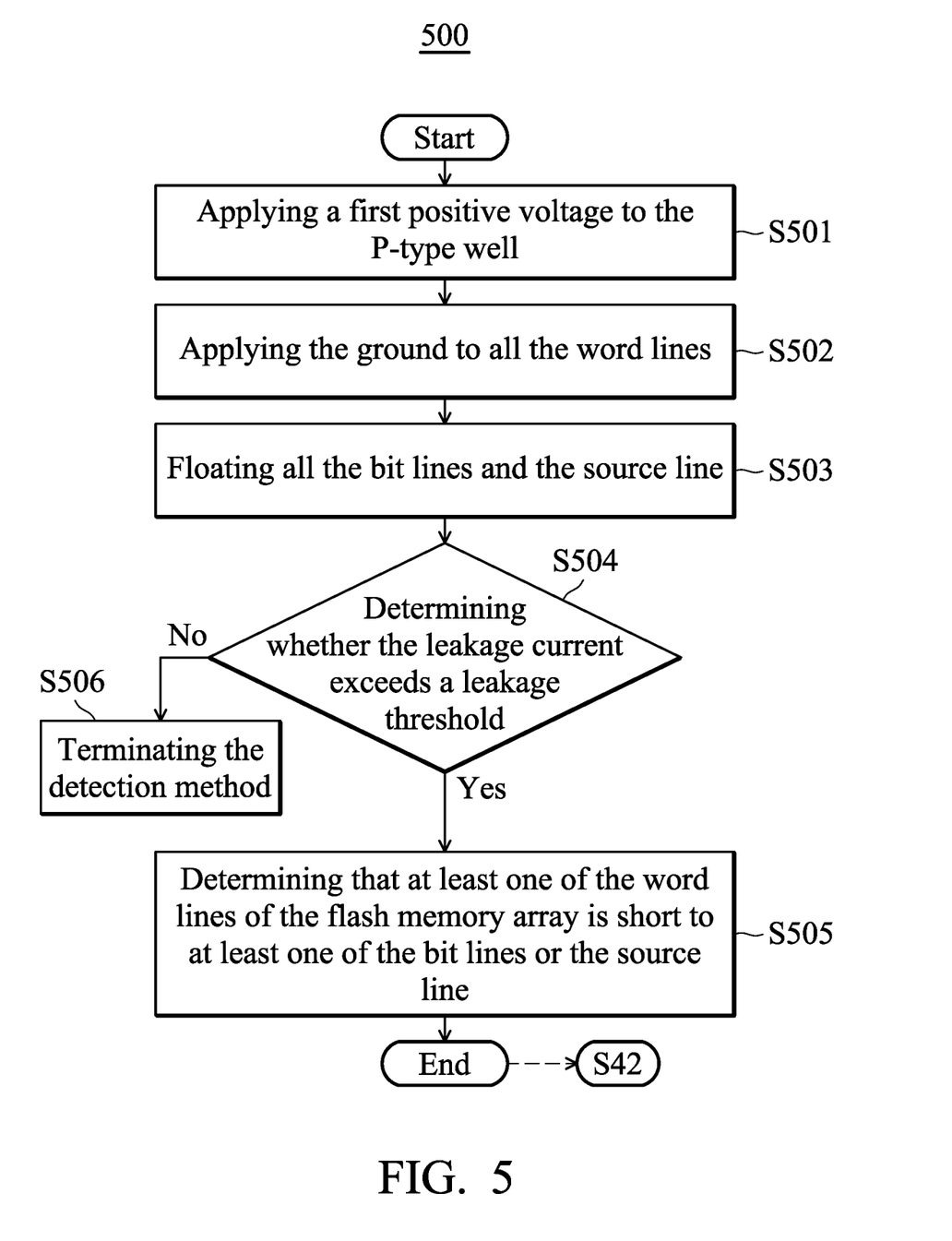
FIG. 5 is a flow chart of the first detection process in Step S41 in accordance with an embodiment of the invention.

FIG. 5 is a flow chart of the first detection process in Step S41 in accordance with an embodiment of the invention. The following description of the first detection process 500 in FIG. 5 is accompanied by FIGS. 1-3 for a detailed explanation. As shown in FIG. 5, in the first detection process 500, which corresponds to Step S41 of the detection method 400 in FIG. 4, the bias circuit 120 applies a first positive voltage to the P-type well 310 in FIG. 3 of the flash memory array 110 (Step S501). The bias circuit 120 applies the ground to all the word lines WL<0>, WL<1>, ..., WL<p>, ..., WL<m> of the flash memory array 110 (Step S502), and also floats all the bit lines BL<0>, BL<1>, ..., BL<k>, ..., BL<n> and the source line SL (Step S503).

Then, the controller 140 determines whether a leakage current flowing through the P-type well 310 exceeds a leakage threshold (Step S504). When the leakage current exceeds the leakage threshold, the controller 140 determines that at least one of the word lines WL<0>, WL<1>, ..., WL<p>, ..., WL<m> of the flash memory array 110 is short-circuited with at least one of the bit lines BL<0>, BL<1>, ..., BL<k>, ..., BL<n> or the source line SL (Step S505). Step S42 is then executed to further determine which word line is short-circuited with at least one of the bit lines or the source lines after the first detection process 500 is terminated.

According to an embodiment of the invention, referring to FIG. 3, the P-type well 310 is biased to the positive voltage, all the bit lines BL<0>, BL<1>, ..., BL<k>, ..., BL<n>, which are illustrated by the bit line BL in FIG. 3, and the source line SL are floated, and all the word lines WL<0>, WL<1>, ..., WL<p>, ..., WL<m>, which are illustrated by the word line WL in FIG. 3, are biased to the ground. When the controller 140 determines that the leakage current flowing through the P-type well 310 exceeds the leakage threshold, it indicates that either the bit line BL in FIG. 3 or the source line SL is short-circuited with the word line WL in FIG. 3 to generate the leakage current flowing through the P-type well 310.

When the flash memory array 110 is determined that at least one of the word lines is short-circuited with at least one of the bit lines or the source line, the controller 140 goes back to Step S504, when the controller 140 determines that the leakage current does not exceed the leakage threshold, it indicates that the flash memory array 110 is functioning normally and the detection method is therefore terminated (Step S506). After the first detection process 500, whether at least one of the word lines in the flash memory array 110 is short-circuited with at least one of the bit lines or the source line is determined.

Figure 6:
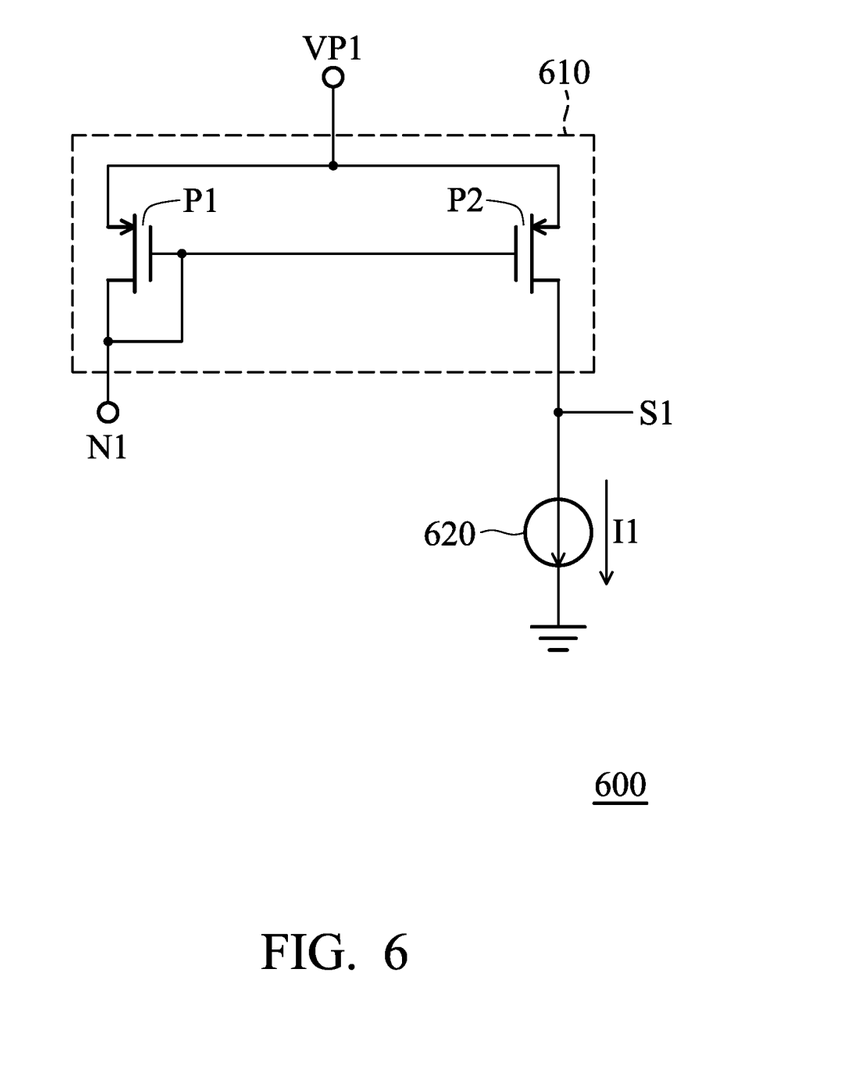
FIG. 6 is a schematic diagram illustrated the bias circuit 120 for the first detection process 500 in accordance with an embodiment of the invention.

FIG. 6 is a schematic diagram illustrated the bias circuit 120 for the first detection process 500 in accordance with an embodiment of the invention. As shown in FIG. 6, the bias circuit 600, which corresponds to the bias circuit 120 in FIG. 1, includes a current mirror 610 and a first current source 620. The current mirror 610, which is supplied by a first positive voltage VP1 and coupled to a first node N1 and a first output node S1, includes a diode-connected P-type transistor P1 and a P-type transistor P2. The first node N1 is coupled to the P-type well 310 in FIG. 3.

The first current source 620 generates a first constant current I1 which is the leakage threshold in Step S504 in FIG. 5. According to an embodiment of the invention, when the leakage current flowing through the P-type well 310 in FIG. 3 exceeds the first constant current IL the first output node S1 is in the high logic level.

According to another embodiment of the invention, when the leakage current flowing through the P-type well 310 in FIG. 3 does not exceed the first constant current I1, the first output node S1 is in the low logic level. Therefore, the controller 140 in FIG. 1 can determine whether the leakage current exceeds the leakage threshold according to the logic level of the first output node S1.

Figure 7:
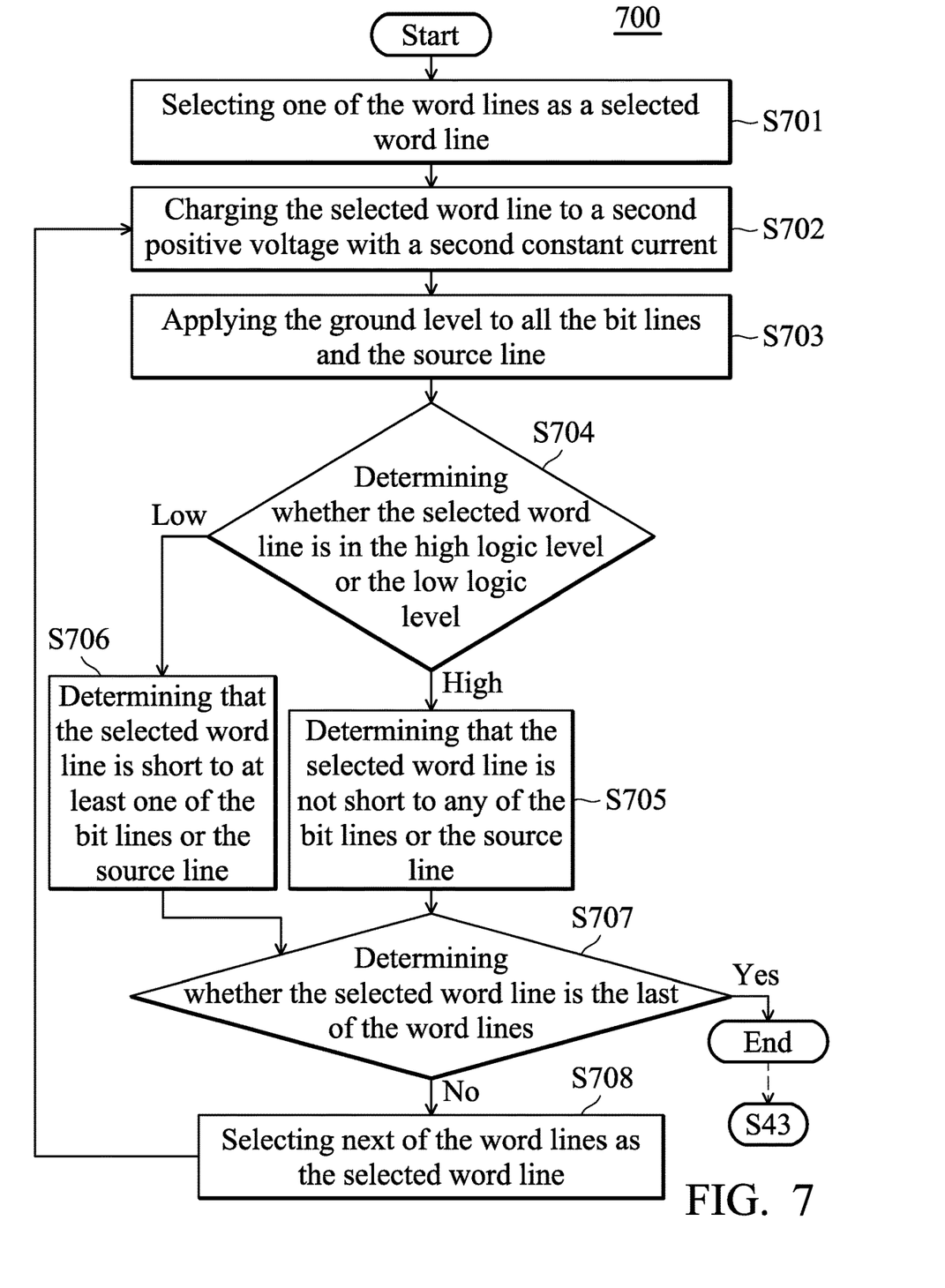
FIG. 7 is a flow chart of the second detection process in Step S42 in accordance with an embodiment of the invention.

FIG. 7 is a flow chart of the second detection process in Step S42 in accordance with an embodiment of the invention. The following description of the second detection process 700 in FIG. 7 is accompanied by FIGS. 1-3 for a detailed explanation. As shown in FIG. 7, in the second detection process 700, which corresponds to Step S42 of the detection method 400 in FIG. 4, the controller 140 selects one of the word lines WL<0>, WL<1>, . . . , WL<p>, . . . , WL<m> as a selected word line (Step S701).

According to an embodiment of the invention, the controller 140 may sequentially select one of the word lines WL<0>, WL<1>, . . . , WL<p>, . . . , WL<m> as a selected word line. According to other embodiments of the invention, the controller 140 may select one of the word lines WL<0>, WL<1>, . . . , WL<p>, . . . , WL<m> in any specified order as a selected word line.

When one of the word lines WL<0>, WL<1>, . . . , WL<p>, . . . , WL<m> is selected, the bias circuit 120 charges the selected word line to a second positive voltage with a second constant current (Step S702). The bias circuit 120 also applies the ground level to all the bit lines BL<0>, BL<1>, . . . , BL<k>, . . . , BL<n> and the source line SL (Step S703). The controller 140 determines whether the selected word line is in the high logic level or the low logic level (Step S704).

When the selected word line is determined to be in the high logic level, the controller 140 determines that the selected word line is not short-circuited with any of the bit lines BL<0>, BL<1>, . . . , BL<k>, . . . , BL<n> or the source line SL (Step S705). When the selected word line is determined to be in the low logic level, the controller 140 determines that the selected word line is short-circuited with at least one of the bit lines BL<0>, BL<1>, . . . , BL<k>, . . . , BL<n> or the source line SL (Step S706).

After Step S705 and Step S706, the controller 140 further determines whether the selected word line is the last of the word lines WL<0>, WL<1>, . . . , WL<p>, . . . , WL<m> (Step S707). When the selected word line is not the last of the word lines WL<0>, WL<1>, . . . , WL<p>, . . . , WL<m>, the controller 140 selects the next word line WL<0>, WL<1>, . . . , WL<p>, . . . , WL<m> as the selected word line (Step S708) and returns to Step S702. When the selected word line is the last of the word lines WL<0>, WL<1>, . . . , WL<p>, . . . , WL<m>, the controller 140 ends the second detection process 700 and then executes Step S43.

Figure 8:
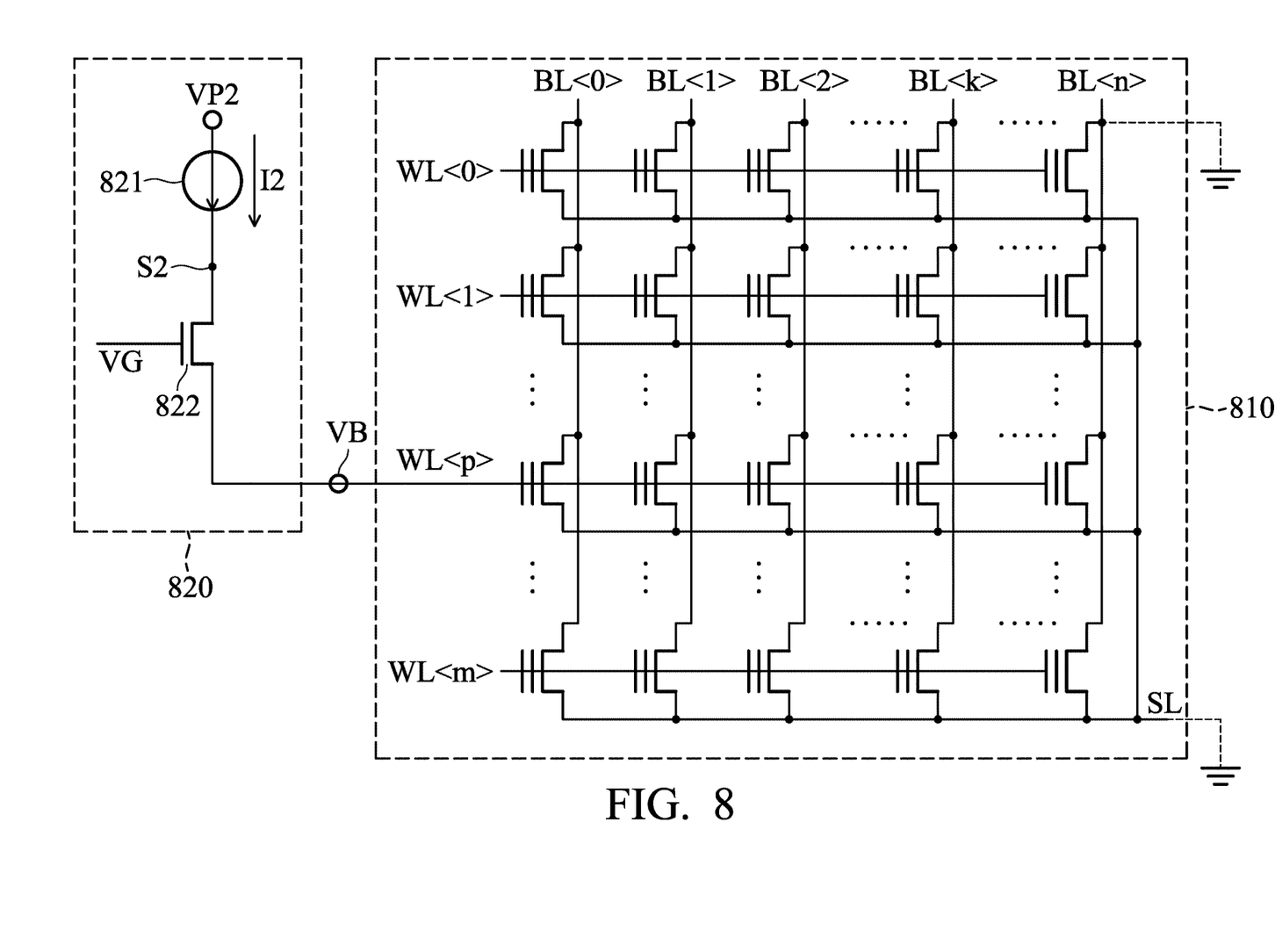
FIG. 8 is a schematic diagram illustrating the flash memory array 110 detected by the second detection process 700 in accordance with an embodiment of the invention.

FIG. 8 is a schematic diagram illustrating the flash memory array 110 detected by the second detection process 700 in accordance with an embodiment of the invention. As shown in FIG. 8, the flash memory array 810 is identical to the flash memory 200 in FIG. 2 which corresponds to the flash memory array 110 in FIG. 1, and the bias circuit 820 corresponds to the bias circuit 120 in FIG. 1. According to an embodiment of the invention, the bias circuit 820 may bias the flash memory array 810 through an X decoder, which is not shown in FIG. 8.

The bias circuit 820 includes a second current source 821 and a limiting N-type transistor 822. The second current source 822 generates a second current I2 from the second positive voltage VP2 which charges the selected word line with the second current I2. As shown in FIG. 8, the selected word line is illustrated by the word line WL<p>. The limiting N-type transistor 822 is configured to not limit the bias voltage VB on the selected word line by the gate voltage VG. According to an embodiment of the invention, when executing the second detection process 700 in FIG. 7, the gate voltage VG exceeds the second positive voltage VP2 such that the bias voltage VB is not limited by the gate voltage VG.

The bias circuit 820 also applies the ground level to the bit lines BL<0>, BL<1>, . . . , BL<k>, . . . , BL<n> and source line SL. According to an embodiment of the invention, when the selected word line, which is illustrated by the word line WL<p> in FIG. 8, is short-circuited with at least one of the bit lines BL<0>, BL<1>, . . . , BL<k>, . . . , BL<n> or the source line SL, the second output node S2 is in the low logic level.

According to another embodiment of the invention, when the selected word line, which is illustrated by the word line WL<p> in FIG. 8, is not short-circuited with at least one of the bit lines BL<0>, . . . , BL<k>, . . . , BL<n> or the source line SL, the second output node S2 is in the high logic level. Therefore, the controller 140 may determine whether the selected word line is short-circuited with at least one of the bit lines BL<0>, . . . , BL<k>, . . . , BL<n> or the source line SL according to the logic level of the second output node S2.

Figure 9:
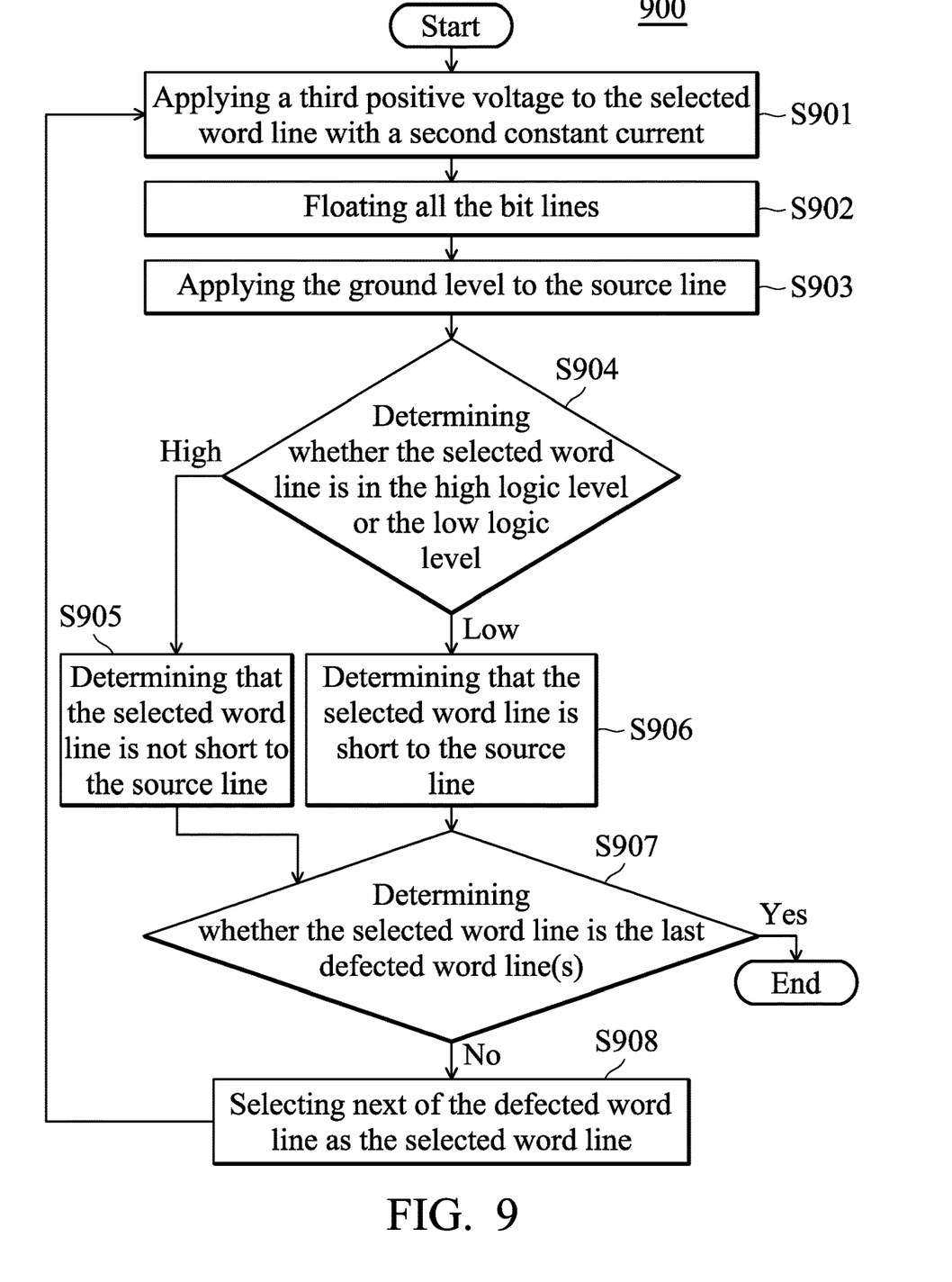
FIG. 9 is a flow chart of the third detection process in Step S43 in accordance with an embodiment of the invention.

FIG. 9 is a flow chart of the third detection process in Step S43 in accordance with an embodiment of the invention. The following description of the third detection process 900 in FIG. 9 is accompanied by FIGS. 1-3 for a detailed explanation. As shown in FIG. 9, in the third detection process 900, which corresponds to Step S43 of the detection method 400 in FIG. 4, the bias circuit 120 applies a third positive voltage to the selected word line with a second constant current (Step S901) without turned ON the memory cells on the selected word line.

According to an embodiment of the invention, once the memory cells on the selected word line are turned ON, the source line SL would be short-circuited with the bit lines which are short-circuited with the selected word line, resulting in an error detection result. According to an embodiment of the invention, the selected word line in Step S901 is one of the word lines which is detected to be defective in the second detection process 700. Therefore, the second detection process 700 is configured to identify which word lines are defective so that the defective word lines can be directly selected in the third detection process 900.

Then, the bias circuit 120 floats all the bit lines BL<0>, . . . , BL<k>, . . . , BL<n> (Step S902), and applies the ground to the source line SL (Step S903). The controller 140 determines whether the selected word line is in the high logic level or the low logic level (Step S904).

When the selected word line is in the high logic level, the controller 140 determines that the selected word line is not short-circuited with the source line SL (Step S905). When the selected word line is in the low logic level, the controller 140 determines that the selected word line is short-circuited with the source line SL (Step S906).

After Step S905 and Step S906, the controller 140 determines whether the selected word line is the last defective word line detected in the second process 700 (Step S907). When the selected word line is the last defective word line, the controller 140 ends the third detection process 900. When the selected word line is not the last defective word line, the controller 140 selects the next defective word line as the selected word line (Step S908) and returns to Step S901.

According to an embodiment of the invention, when the selected word line is short-circuited with the source line SL, data stored on the selected word line of the flash memory array 110 is missed and can't be recovered by ECC.

Figure 10:
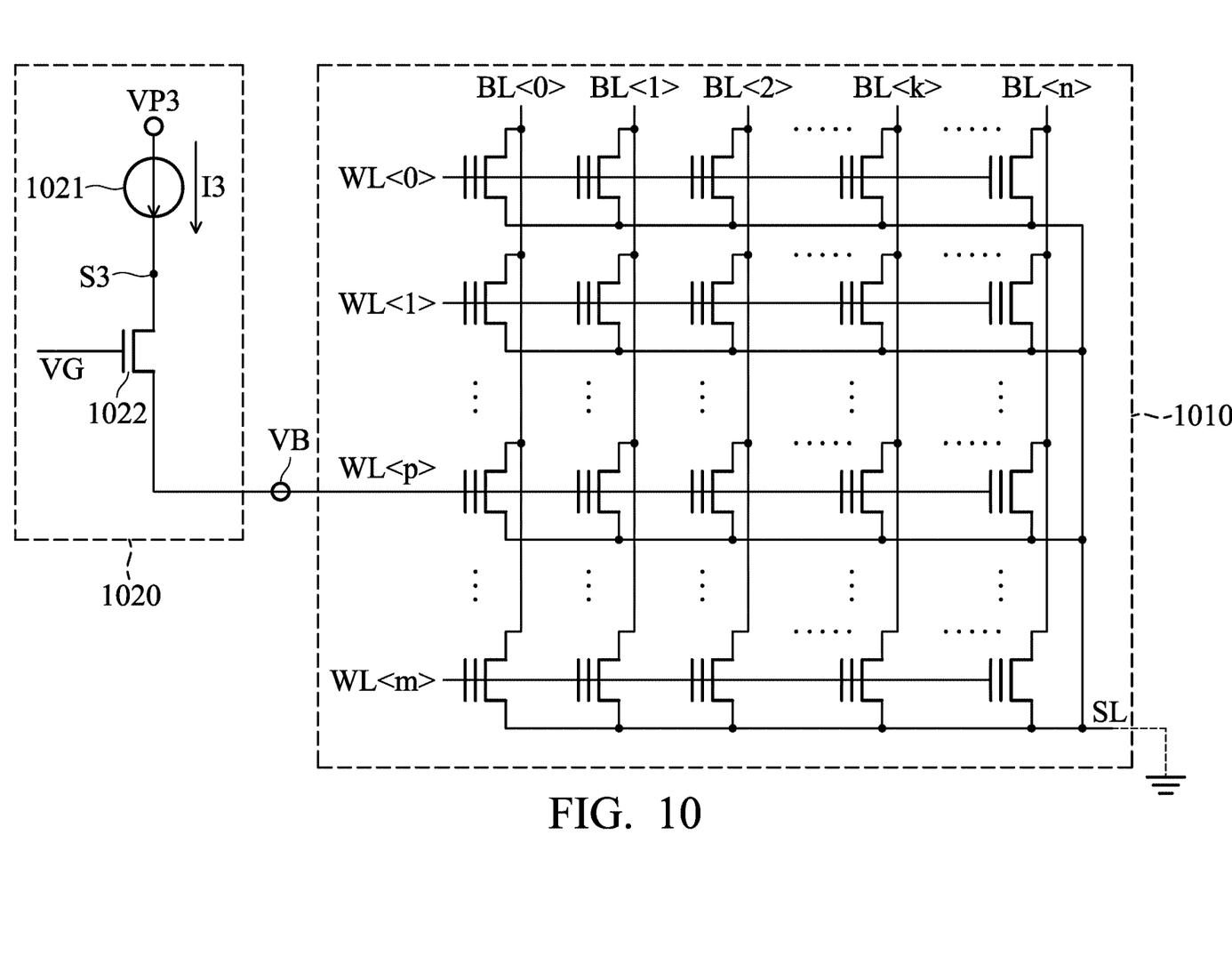
FIG. 10 is a schematic diagram illustrating the flash memory array 110 detected by the third detection process 900 in accordance with an embodiment of the invention.

FIG. 10 is a schematic diagram illustrating the flash memory array 110 detected by the third detection process 900 in accordance with an embodiment of the invention. As shown in FIG. 10, the flash memory array 1010 is identical to the flash memory 200 in FIG. 2 which corresponds to the flash memory array 110 in FIG. 1, and the bias circuit 1020 corresponds to the bias circuit 120 in FIG. 1. According to an embodiment of the invention, the bias circuit 1020 may bias the flash memory array 1010 through an X decoder, which is not shown in FIG. 10.

The bias circuit 1020 includes a third current source 1021 and a limiting N-type transistor 1022. The third current source 1022 generates a third current I3 from the third positive voltage VP3 which charges the selected word line with the third current I3. As shown in FIG. 10, the selected word line is illustrated by the word line WL<p>. The limiting N-type transistor 1022 is configured to limit the bias voltage VB on the selected word line by the gate voltage VG.

According to an embodiment of the invention, when executing the third detection process 900 in FIG. 9, the gate voltage VG is equal to the sum of the erase threshold voltage of the memory cells on the selected word line (i.e., the memory cells on the word line WL<p>) and the threshold voltage of the limiting N-type transistor 1022 such that the memory cells on the selected word line remain OFF.

The bias circuit 1020 applies the ground level to source line SL and floats all the bit lines BL<0>, . . . , BL<k>, . . . , BL<n>. According to an embodiment of the invention, when the selected word line, which is illustrated by the word line WL<p> in FIG. 10, is short-circuited with the source line SL, the third output node S3 is in the low logic level.

According to another embodiment of the invention, when the selected word line is not short-circuited with the ground, the leakage current of the selected word line does not exceed the third current I3 such that the third output node S3 is in the high logic level. Therefore, the controller 140 may determine whether the selected word line is short-circuited with the source line SL according to the logic level of the third output node S3.

Figure 11A:
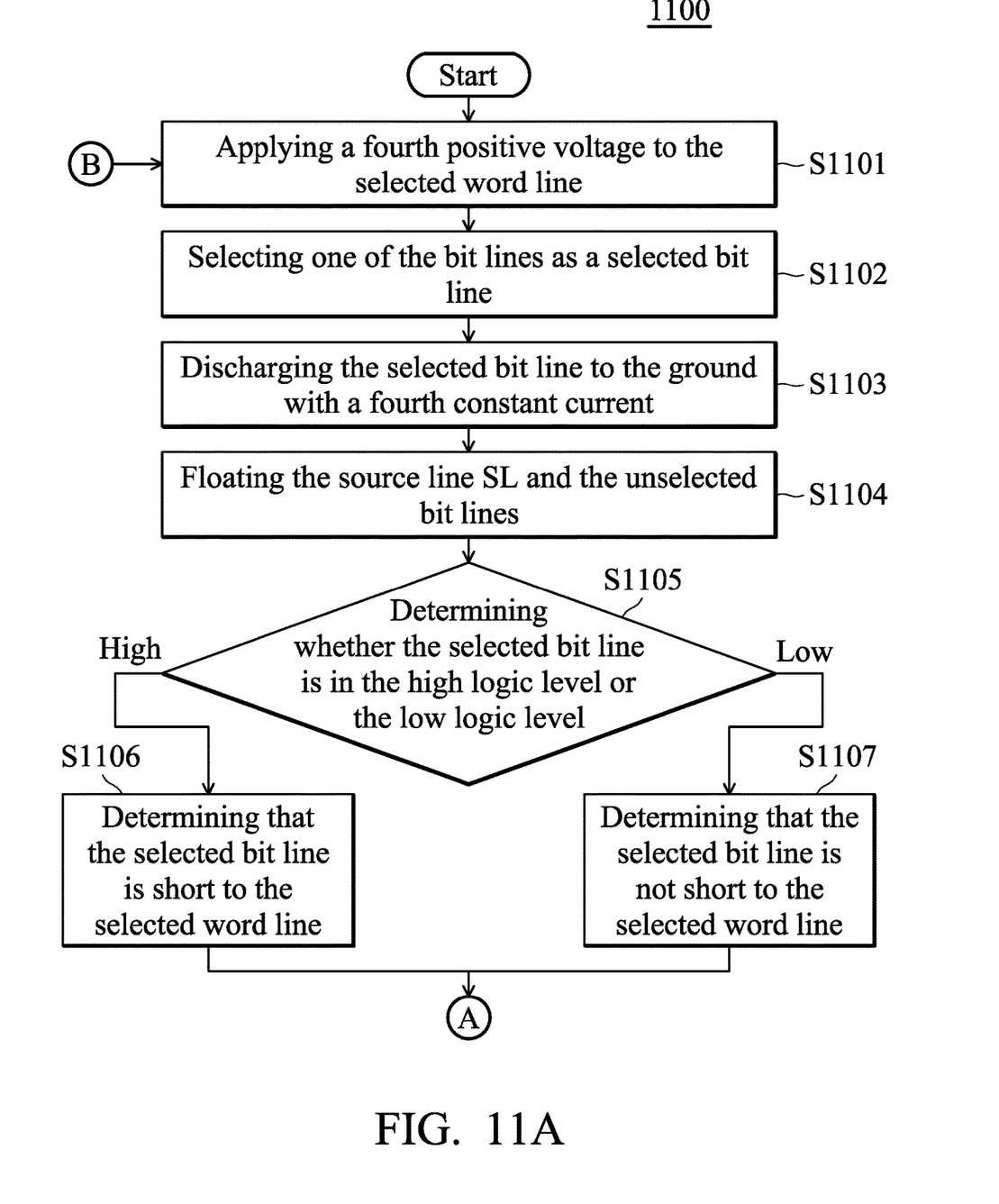
FIGS. 11A to 11B show a flow chart of the fourth detection process in Step S44 in accordance with an embodiment of the invention.
Figure 11B:
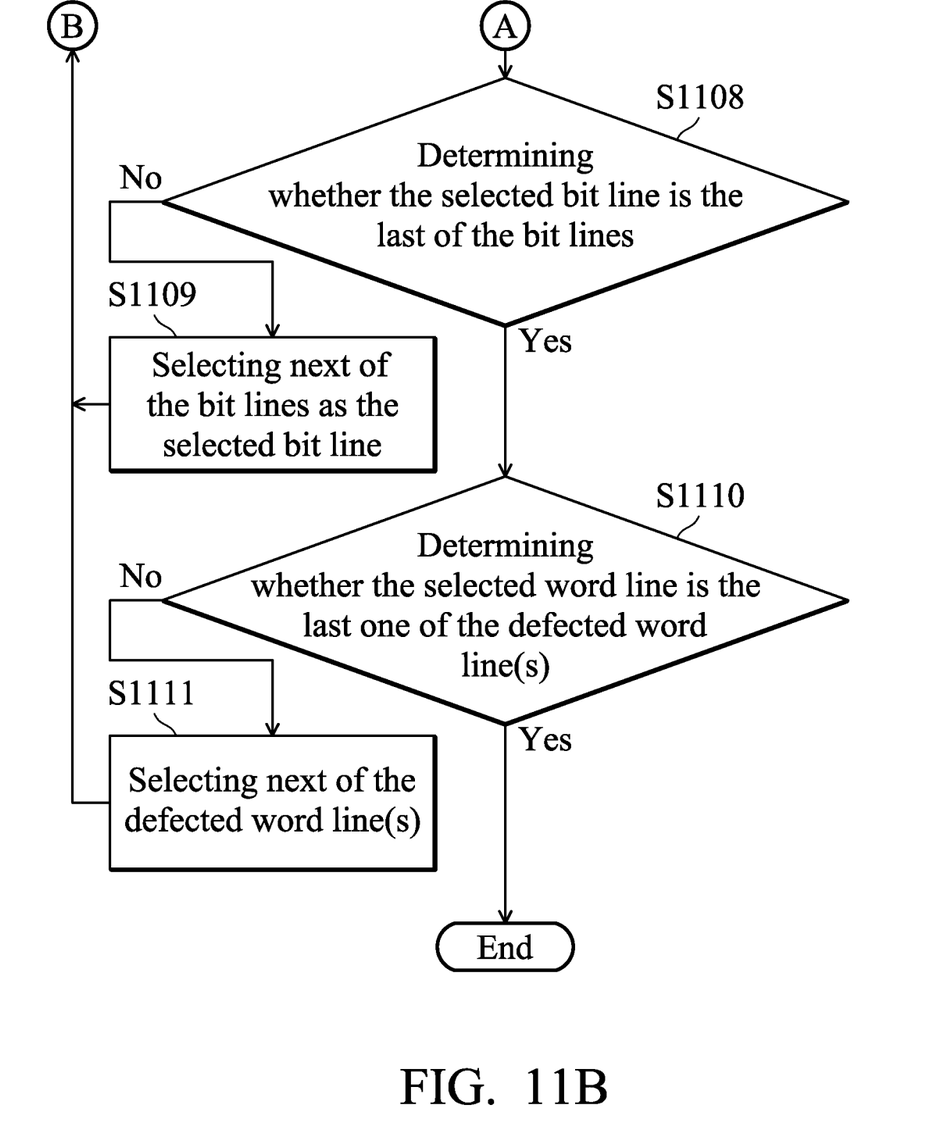

FIGS. 11A to 11B show a flow chart of the fourth detection process in Step S44 in accordance with an embodiment of the invention. The following description of the fourth detection process 1100 in FIGS. 11A to 11B is accompanied by FIGS. 1-3 for a detailed explanation. As shown in FIGS. 11A to 11B, in the fourth detection process 1100, which corresponds to Step S44 of the detection method 400 in FIG. 4, the bias circuit 120 applies a fourth positive voltage to the selected word line (Step S1101) without turned ON the memory cells on the selected word line. According to an embodiment of the invention, the selected word line is one of the defective word line(s) detected in the second detection process 700.

The controller 140 selects one of the bit lines as a selected bit line (Step S1102), in which the rest of the bit lines are unselected bit lines. According to an embodiment of the invention, the controller 140 sequentially selects one of the bit lines as a selected bit line. According to another embodiment of the invention, the controller 140 selects one of the bit lines in any specified order as a selected bit line.

The bias circuit 120 discharges the selected bit line to the ground with a fourth constant current (Step S1103), and floats the source line SL and the unselected bit lines (Step S1104). The controller 140 determines whether the selected bit line is in the high logic level or the low logic level (Step S1105).

When the selected bit line is in the high logic level, the controller 140 determines that the selected bit line is short-circuited with the selected word line (Step S1106). When the selected bit line is in the low logic level, the controller 140 determines that the selected bit line is not short-circuited with the selected word line (Step S1107).

The controller 140 further determines whether the selected bit line is the last of the bit lines BL<0>, . . . , BL<k>, . . . , BL<n> (Step S1108). When the selected bit line is not the last of the bit lines BL<0>, . . . , BL<k>, . . . , BL<n>, the controller 140 selects the next bit line BL<0>, . . . , BL<k>, . . . , BL<n> as the selected bit line (Step S1109).

When the selected bit line is the last of the bit lines BL<0>, . . . , BL<k>, . . . , BL<n>, the controller 140 determines whether the selected word line is the last of the defective word line(s) detected in the second process 700 (Step S1110). When the selected word line is not the last of the defective word line(s), the controller 140 selects the next defective word line (Step S1111), and then returns to Step S1101. When the selected word line is the last of the defective word lines, the fourth detection process 1100 ends, and the detection method 400 ends as well.

Figure 12:
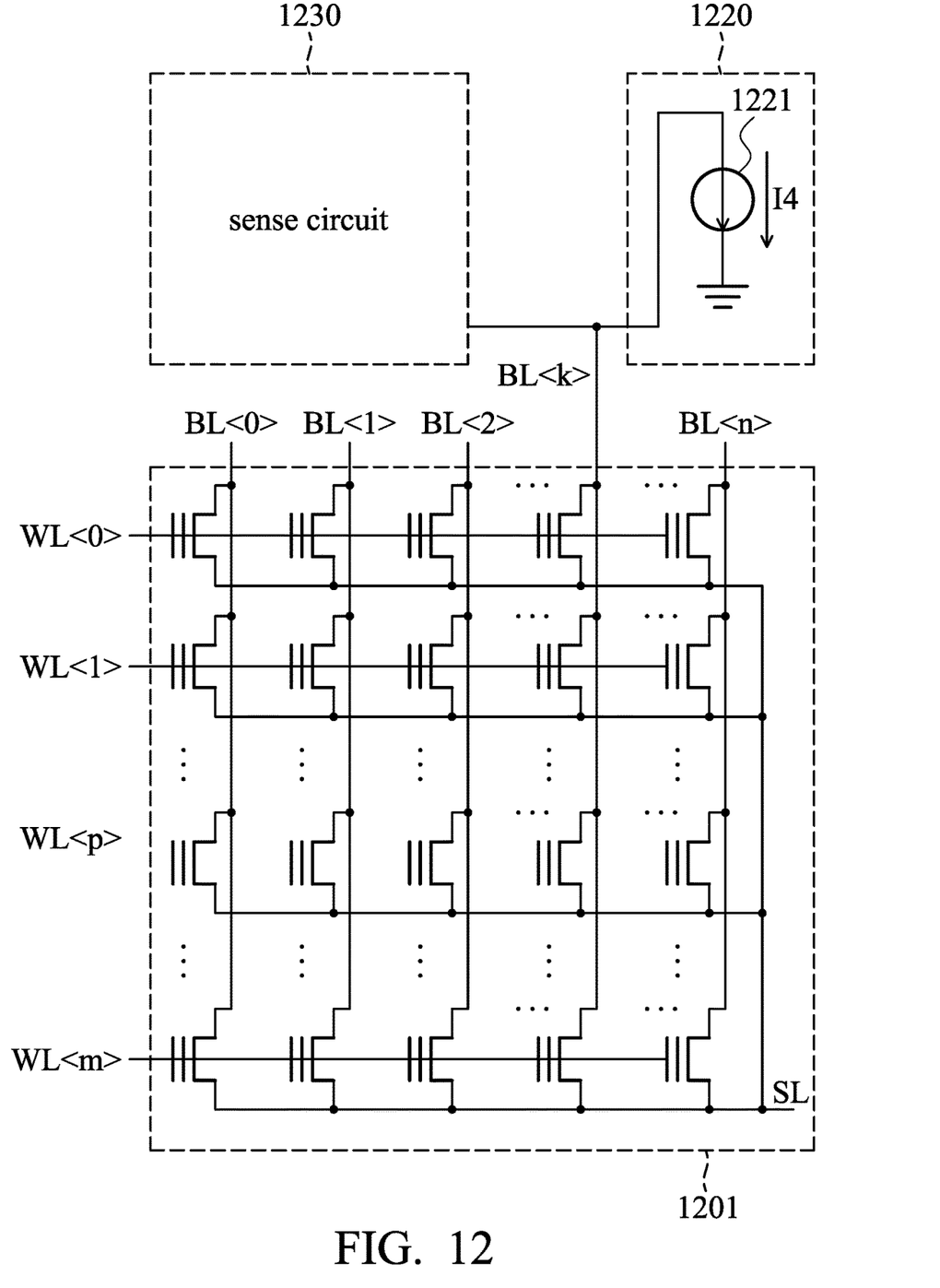
FIG. 12 is a schematic diagram illustrating the flash memory array 110 detected by the fourth detection process 1100 in accordance with an embodiment of the invention.

FIG. 12 is a schematic diagram illustrating the flash memory array 110 detected by the fourth detection process 1100 in accordance with an embodiment of the invention. As shown in FIG. 12, the flash memory array 1210 is identical to the flash memory 200 in FIG. 2 which corresponds to the flash memory array 110 in FIG. 1, and the bias circuit 1220 corresponds to the bias circuit 120 in FIG. 1.

As shown in FIG. 12, the bias circuit 1220 includes a fourth current source 1221. The fourth current source 1221 discharges the selected bit line, which is the bit line BL<k> as illustrated in FIG. 12, to the ground with a fourth current I4. The selected word line can be biased without turning ON any one of the memory cells on the selected word line. According to an embodiment of the invention, the bias circuit 1220 may bias the selected word line as illustrated in FIG. 10 such that the description is not repeated herein.

According to an embodiment of the invention, the source line SL may be floated. According to another embodiment of the invention, the source line may be grounded without influencing the selected bit line since the memory cells on the selected word line remain OFF.

When the selected bit line is discharged to the ground, the sense circuit 1230 determines whether the selected bit line is in the high logic level or the low logic level. When the selected bit line is in the high logic level, it indicates that the selected bit line is short-circuited with the selected word line. When the selected bit line is in the low logic level, it indicates that the selected bit line is not short-circuited with the selected word line.

According to an embodiment of the invention, when the selected bit line is short-circuited with the selected word line, the data stored on the selected bit line of the flash memory array is lost, and, however, the data stored on the selected word line is able to be recovered by ECC.

According to an embodiment of the invention, when the selected bit line is short-circuited with the selected word line, data stored on a memory cell corresponding to the selected word line and the selected bit line is able to be read out by applying a positive voltage to the selected word line and floating the selected bit line. After reading the data stored on the selected word line, all the bit lines should be floated for being discharged to the ground.

After executing the detection method provided herein, the system could be aware of which flash memory array is damaged such that the system could adopt a series of operations to protect the data stored in the flash memory array.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A method for detecting a flash memory array comprising a plurality of word lines, a plurality of bit lines, and a source line, comprising:
executing a first detection process, wherein the first detection process comprises:
applying a first positive voltage to a P-type well of the flash memory array;
applying a ground to all the word lines;
floating the bit lines and the source line;
when the first positive voltage is applied to the P-type well, the ground is applied to all the word lines, and the bit lines and the source line are floated, determining whether a leakage current flowing through the P-type well exceeds a leakage threshold; and
when the leakage current exceeds the leakage threshold, determining that at least one of the word lines is short-circuited with at least one of the bit lines or the source line.

2. The method of claim 1, wherein the first detection process is executed before and after an erase operation, wherein the first detection process further comprises:
when the leakage current does not exceed the leakage threshold, terminating the method.

3. The method of claim 1, wherein after the step of determining that at least one of the word lines is short-circuited with at least one of the bit lines and the source line, the method further comprises:
executing a second detection process, wherein the second detection process comprises:
sequentially selecting one of the word lines as a selected word line;
charging the selected word line to a second positive voltage with a first constant current;
applying the ground to all the bit lines and the source line;
determining whether the selected word line is in a high logic level or a low logic level;
when the selected word line is in the high logic level, determining that the selected word line is not short-circuited with any of the bit lines or the source line; and
when the selected word line is in the low logic level, determining that the selected word line is short-circuited with at least one of the bit lines or the source line.

4. The method of claim 3, wherein after the step of executing the second detection process, the method further comprises:
executing a third detection process, wherein the third detection process further comprises:
applying a third positive voltage to the selected word line with a second constant current, such that memory cells on the selected word line are not turned ON;
floating all the bit lines;
applying the ground to the source line;
determining whether the selected word line is in the high logic level or the low logic level;
when the selected word line is in the high logic level, determining that the selected word line is not short-circuited with the source line; and
when the selected word line is in the low logic level, determining that the selected word line is short-circuited with the source line.

5. The method of claim 4, wherein when the selected word line is short-circuited with the source line, data stored on the selected word line of the flash memory array is missed and can't be recovered by ECC.

6. The method of claim 4, wherein after the step of executing the third detection process, the method further comprises:
executing a fourth detection process, wherein the fourth detection process comprises:
applying a fourth positive voltage to the selected word line, such that memory cells on the selected word line are not turned ON;
sequentially selecting one of the bit lines as a selected bit line, wherein the rest of the bit lines are unselected bit lines;
discharging the selected bit line to the ground with a fourth constant current;
floating the source line and the unselected bit lines;
determining whether the selected bit line is in the high logic level or the low logic level; and
when the selected bit line is in the high logic level, determining that the selected bit line is short-circuited with the selected word line.

7. The method of claim 6, wherein the fourth detection process further comprises:
when the selected bit line is in the low logic level, determining that the selected bit line is not short-circuited with the selected word line.

8. The method of claim 7, wherein after the step of determining that the selected bit line is short-circuited with the selected word line or the step of determining that the selected bit line is not short-circuited with the selected word line, the fourth detection process further comprises:
determining whether the selected bit line is the last of the bit lines; and
when the selected bit line is not the last of the bit lines, selecting the next bit line as the selected bit line, wherein the rest of the bit lines are the unselected bit lines.

9. The method of claim 6, wherein when the selected bit line is short-circuited with the selected word line, data stored on the selected bit line of the flash memory array is lost, and data stored on the selected word line is able to be recovered by ECC.

10. The method of claim 6, wherein when the selected bit line is short-circuited with the selected word line, data stored on a memory cell corresponding to the selected word line and the selected bit line is able to be read out by applying a positive voltage to the selected word line and floating the selected bit line, wherein after reading the data stored on the selected word line, all the bit lines are floated for discharging to the ground.

11. A device, comprising:
a flash memory array, comprising a plurality of word lines, a plurality of bit lines, a source line, and a P-type well;
a bias circuit, configured to generate voltages and currents for the flash memory array;
a sense circuit, configured to sense logic levels of the word lines, the bit lines, the source line, and a leakage current of the P-type well; and a controller, configured to select the word lines and the bit lines and to execute a method comprising a first detection process, wherein the first detection process comprises:
applying a first positive voltage to a P-type well of the flash memory array;
applying a ground to all the word lines;
floating the bit lines and the source line;
when the first positive voltage is applied to the P-type well, the ground is applied to all the word lines, and the bit lines and the source line are floated, determining whether the leakage current flowing through the P-type well exceeds a leakage threshold; and
when the leakage current exceeds the leakage threshold, determining that at least one of the word lines is short-circuited with at least one of the bit lines or the source line.

12. The device of claim 11, wherein the first detection process is executed before and after an erase operation, wherein the first detection process further comprises:
when the leakage current does not exceed the leakage threshold, terminating the method.

13. The device of claim 11, wherein after the step of determining that at least one of the word lines is short-circuited with at least one of the bit lines and the source line, the method further comprises executing a second detection process, wherein the second detection process comprises:
sequentially selecting one of the word lines as a selected word line;
charging the selected word line to a second positive voltage with a first constant current;
applying the ground to all the bit lines and the source line;
determining whether the selected word line is in a high logic level or a low logic level;
when the selected word line is in the high logic level, determining that the selected word line is not short-circuited with any of the bit lines or the source line; and
when the selected word line is in the low logic level, determining that the selected word line is short-circuited with at least one of the bit lines or the source line.

14. The device of claim 13, wherein after the step of executing the second detection process, the method further comprises executing a third detection process, wherein the third detection process further comprises:
applying a third positive voltage to the selected word line with a second constant current, such that memory cells on the selected word line are not turned ON;
floating all the bit lines;
applying the ground to the source line;
determining whether the selected word line is in the high logic level or the low logic level;
when the selected word line is in the high logic level, determining that the selected word line is not short-circuited with the source line; and when the selected word line is in the low logic level, determining that the selected word line is short-circuited with the source line.

15. The device of claim 14, wherein when the selected word line is short-circuited with the source line, data stored on the selected word line of the flash memory array is missed and can't be recovered by ECC.

16. The device of claim 14, wherein after the step of executing the third detection process, the method further comprises executing a fourth detection process, wherein the fourth detection process comprises:
applying a fourth positive voltage to the selected word line, such that memory cells on the selected word line are not turned ON;
sequentially selecting one of the bit lines as a selected bit line, wherein the rest of the bit lines are unselected bit lines;
discharging the selected bit line to the ground with a fourth constant current;
floating the source line and the unselected bit lines;
determining whether the selected bit line is in the high logic level or the low logic level; and
when the selected bit line is in the high logic level, determining that the selected bit line is short-circuited with the selected word line.

17. The device of claim 16, wherein the fourth detection process further comprises:
when the selected bit line is in the low logic level, determining that the selected bit line is not short-circuited with the selected word line.

18. The device of claim 17, wherein after the step of determining that the selected bit line is short-circuited with the selected word line or the step of determining that the selected bit line is not short-circuited with the selected word line, the fourth detection process further comprises:
determining whether the selected bit line is the last of the bit lines; and
when the selected bit line is not the last of the bit lines, selecting the next bit line as the selected bit line, wherein the rest of the bit lines are the unselected bit lines.

19. The device of claim 16, wherein when the selected bit line is short-circuited with the selected word line, data stored on the selected bit line of the flash memory array is lost, and data stored on the selected word line is able to be recovered by ECC.

20. The device of claim 16, wherein when the selected bit line is short-circuited with the selected word line, the controller reads out data stored on a memory cell corresponding to the selected word line by applying a positive voltage to the selected word line and leaves the selected bit line to be floated, wherein after reading the data stored on the selected word line, all the bit lines are floated for discharging to the ground.

* * * * *